United States Patent [19]

Mittal et al.

[11] 4,450,505

[45] May 22, 1984

[54] APPARATUS FOR COOLING INTEGRATED CIRCUIT CHIPS

[75] Inventors: Faquir C. Mittal, Audubon, Pa.; Joseph S. Mathias, Riverton, N.J.

[73] Assignee: Sperry Corporation, New York, N.Y.

[21] Appl. No.: 386,557

[22] Filed: Jun. 9, 1982

[51] Int. Cl.³ ............................................. H05K 7/20
[52] U.S. Cl. ................................. 361/386; 361/385; 361/399
[58] Field of Search ................................... 174/164 S; 165/104–133, 80 C, 80 E; 357/82; 361/384–386, 395, 399, 415

[56] References Cited

U.S. PATENT DOCUMENTS

| | | | |
|---|---|---|---|
| 4,138,692 | 2/1979 | Meeker | 357/82 |
| 4,156,458 | 5/1979 | Chu | 165/81 |
| 4,203,129 | 5/1980 | Oktay | 357/82 |

OTHER PUBLICATIONS

Buller, "Dendritic Heat Sink", IBM Tech. Discl. Bull., vol. 23, No. 11, Apr. 1981, pp. 4853.
Johnson, "Device Cooling", IBM Tech. Discl. Bull., vol. 20, No. 10, Mar. 1978, pp. 3919.

*Primary Examiner*—G. P. Tolin
*Attorney, Agent, or Firm*—James R. Bell; Marshall M. Truex

[57] ABSTRACT

A multichip thermal conduction module has improved cooling in a housing having a board including chips mounted on the board. The housing is divided so as to form first and second cooling portions. The chips are in the first cooling portion. Several bellows extend into the first cooling portion so that each bellows is urged into deflecting contact with a respective chip. A plurality of heat conducting strands are mounted in each bellows and extend into the second cooling portion. A fluid coolant is directed to flow across the heat conducting strands.

3 Claims, 1 Drawing Figure

U.S. Patent        May 22, 1984        4,450,505
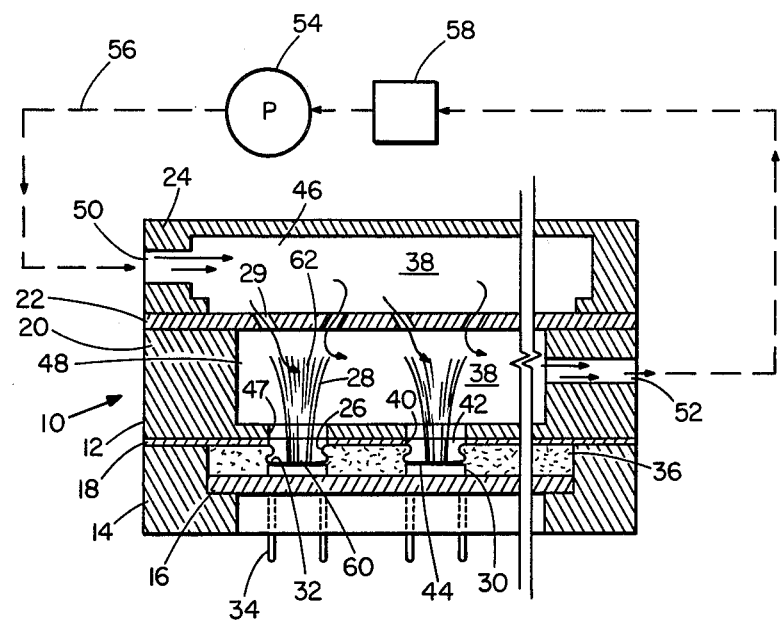

APPARATUS FOR COOLING INTEGRATED CIRCUIT CHIPS

BACKGROUND OF THE INVENTION

1. Field of the Invention

This invention relates generally to heat exchange of an electrical article and more particularly to cooling a module containing a plurality of integrated circuit chips.

2. Description of the Prior Art

The temperature of integrated circuit chips must be kept below specified limits to ensure proper function, reliability and useful life. The trend is integrated circuit technology is to pack more circuits per chip which increases the heat generation per chip. Also, system designers are mounting chips closer together to minimize propagation delays in the interconnections. These trends and designs have increased heat flux, i.e. power per unit area, and caused a need for new cooling techniques.

In the conduction cooling of heat producing elements, a conductive heat transfer medium (a solid) is placed into contact with a heat producing element. The medium either has, or contacts another element which has, a greater surface area relative to the heat producing element so that heat is more easily dissipated from the greater surface area. To enhance heat dissipation from surface areas, a fluid is often used as a heat transfer medium by being moved over the heat dissipating surface area to "carry away" heat by convection. From the foregoing it becomes quite clear that heat transfer is enhanced when there is greater surface contact between a heat producing element and a heat transfer medium.

The development of multichip thermal conduction modules to enhance the cooling of concentrations of chips resulted in various conduction cooling techniques including a plurality of resiliently urged pistons each contacting a chip and providing a thermal path to a portion of the module housing which is convection cooled by a fluid coolant.

This technique was further enhanced by encapsulating the pistons in Helium gas to promote conducting cooling. Also, coolants such as air, water or fluorocarbons have been pumped through the housings.

Such pistons limit heat transfer regardless of piston geometry due to the rigidity of the piston. For example, if the piston has a curved contact surface then limited point contact with the relatively planar chip surface results in reduced heat transfer. Where the piston also has a relatively planar contact surface, the piston and chip contact surfaces must be in substantial alignment to avoid point contact.

The foregoing illustrates limitations of the known prior art. Thus, it is apparent that it would be advantageous to provide an alternative directed to overcoming one or more of the limitations as set forth above. Accordingly, a suitable alternative is provided including features more fully disclosed hereinafter.

SUMMARY OF THE INVENTION

In one aspect of the present invention, this is accomplished by providing an apparatus for cooling integrated circuit chips including a housing having a board including chips mounted on the board. Means are mounted in the housing so as to form first and second cooling portions; the chips having a planar surface extending into the first cooling portion. First flexible means each have a first end connected to the mounted means and a second end for conforming into alignment the planar surface in response to being urged into deflecting contact with a respective chip. Second flexible means each have a first end connected to a respective one of said first means and a second end extending into said second cooling portion. A fluid inlet and a fluid outlet are provided in the second cooling portion.

The foregoing and other aspects will become apparent from the following detailed description of the invention when considered in conjunction with the accompanying drawing. It is to be expressly understood, however, that the drawing is not intended as a definition of the invention but is for the purpose of illustration only.

BRIEF DESCRIPTION OF THE DRAWING

In the drawing:

The drawing FIGURE graphically illustrates an embodiment of the module of this invention.

DESCRIPTION OF THE PREFERRED EMBODIMENT

An apparatus for cooling integrated circuit chips is illustrated in the drawing FIGURE as an improved thermal conduction module generally designated 10. Module 10 includes a housing assembly 12 having a base 14, a board 16, a heat conducting plate 18, a cold plate 20, a resistor plate 22, a cap 24 and first and second flexible means 26, 28. Assembly 12 is suitably sealed together.

Board 16 is well known and includes a plurality of integrated circuit chips 30 mounted thereon having a substantially planar surface 32. A plurality of connector pins 34 are also mounted on board 16. Board 16 is mounted in base 14 typically formed of a good thermally conductive material such as, for example, Aluminum.

Heat conducting plate 18 is preferably of a suitable material such as Copper and provides a means mounted in housing 12 for forming first and second cooling portions 36, 38, respectively. Chips 30 have their planar surface 32 extending into first cooling portion 36. A plurality of apertures 40 are formed in heat conducting plate 18.

First flexible means 26 such as microbellows is formed of a suitable material such as Nickel or Beryllium Copper and has an open end 42 mounted in aperture 40 of plate 18. A second closed end 44 is substantially planar and is urged into contact with surface 32 of chip 30. Due to the inherent flexibility of bellows 26, end 44 will comply or conform into abutting engagement with surface 32 in response to being urged into surface-to-surface contact with a respective chip. Such surface-to-surface contact, as opposed to point contact, reduces contact resistance between chip 30 and bellows 26 and thus improved the rate of heat transfer therebetween.

Second cooling portion 38 is formed by a cold plate and a cap 20, 24, respectively, formed of a suitable material such as Aluminum. Resistor plate 22 separates an entrance chamber 46 from an exit chamber 48. Plate 22 includes a plurality of apertures 29 formed therein for directing coolant fluid between entrance chamber 46 and exit chamber 48 in a predetermined direction. Plate 22 is also formed of a suitable material such as Aluminum. A fluid inlet 50 is formed in cap 24 for admitting coolant into entrance chamber 46 and a fluid outlet 52 for exiting coolant from exit chamber 48. Cold plate 20 includes apertures 47 aligned with apertures 40 of heat conducting plate 18.

A pump 54 and appropriate conduit 56 may be appropriately connected to inlet 50 and outlet 52 for moving a suitable fluid coolant, e.g. air, water, fluorocarbon, through second portion 38. A heat exchanger 58, or some suitable means for re-cooling the fluid, is provided. Also, if desired an inert fluid such as Helium, may be provided in first cooling portion 36.

Second flexible means 28, such as a bunch of heat conducting flexible strands, are formed of a suitable material e.g. Beryllium Copper and include a first end 60 suitably soldered, brazed, or the like to closed end 44 of bellows 26. A second end 62 extends freely through apertures 40, 47 and into second cooling portion 38 and terminates in exit chamber 48 adjacent apertures 29 of resistor plate 22.

In operation, heat is conducted from chips 30 to exit chamber 48 via bellows 26 and strands 28. Thermal conduction in first cooling portion 36 may be enhanced by the presence of Helium if desired. Fluid moved thorugh second cooling portion 38 by pump 54 provides convection cooling to dissipate heat from strands 28. Convection cooling is enhanced due to fluid being directed through apertures 29 which interconnect entrance chamber 46 and exit chamber 48.

The foregoing has described an improved apparatus for cooling integrated circuit chips. As a result of this invention, a conductive heat transfer medium is provided which is axially and angularly compliant with the chip surface. Thus, there is a substantial increase in surface area contact between the medium, in this case a microbellows, and a surface of the chip. The strands provide an additional means of conducting heat from the bellows/chip interface and the air provides convection cooling of the strands.

It is anticipated that aspects of the present invention, other than those specifically defined in the appended claims, can be obtained from the foregoing description and the drawings.

Having thus described the invention, what is claimed is:

1. An integrated circuit chips cooling apparatus, comprising:
    a housing including a board having integrated circuit chips mounted thereon, said chips having a substantially planar surface;
    means mounted in the housing and forming first and second cooling portions, said chips being in said first portion, said second cooling portion including an entrance chamber separated from an exit chamber by a plate having a plurality of apertures formed therein;
    first means being a flexible bellows having a first end connected to said mounted means and a second end extending into said first cooling portion and conforming contact with said planar surface said bellows having an inside width;
    second means being a bunch of heat conducting strands having a first end connected to said bellows and a second end extending into said second cooling portion and terminating adjacent said apertures, said first end of said bunch of strands having a first width and said second end having a second width wider than said first width, said first width being less than said inside width and said second width being at least as wide as said inside width;
    a fluid inlet in said entrance chamber; and
    a fluid outlet in said exit chamber.
2. The apparatus of claim 1 including:
    means connected to said inlet and outlet for moving a fluid coolant through said second cooling portion.
3. The apparatus of claim 1 including:
    an inert fluid in said first cooling portion.

* * * * *